United States Patent
Costello et al.

(10) Patent No.: US 7,012,328 B2
(45) Date of Patent: Mar. 14, 2006

(54) SEMICONDUCTOR DIE ATTACHMENT FOR HIGH VACUUM TUBES

(75) Inventors: Kenneth A Costello, Alameda County, CA (US); Kevin James Roderick, Santa Clara County, CA (US)

(73) Assignee: Intevac, Inc., Santa Clara, CA (US)

( * ) Notice: Subject to any disclaimer, the term of this patent is extended or adjusted under 35 U.S.C. 154(b) by 11 days.

(21) Appl. No.: 10/846,060

(22) Filed: May 14, 2004

(65) Prior Publication Data

US 2005/0253242 A1    Nov. 17, 2005

(51) Int. Cl.
*H01L 23/22* (2006.01)
*H01L 23/24* (2006.01)
(52) U.S. Cl. ...................... 257/687; 257/730
(58) Field of Classification Search ............ 257/687, 257/690, 698, 700, 730, 737
See application file for complete search history.

(56) References Cited

U.S. PATENT DOCUMENTS

| | | |
|---|---|---|
| 4,687,922 A | 8/1987 | Lemonier et al. |
| 6,020,646 A | 2/2000 | Boyle et al. |
| 6,281,572 B1 * | 8/2001 | Robbins ............ 257/700 |
| 6,285,018 B1 | 9/2001 | Aebi et al. |
| 6,507,147 B1 | 1/2003 | Costello |
| 6,614,110 B1 | 9/2003 | Pace |
| 6,656,768 B1 | 12/2003 | Thomas |
| 6,747,258 B1 | 6/2004 | Benz et al. |

OTHER PUBLICATIONS

Kyocera's "Multilayer Ceramics Design Guide", 1995 CAT/2T9504THA/1244E.

* cited by examiner

*Primary Examiner*—Phuc T. Dang
(74) *Attorney, Agent, or Firm*—Stanley Z Cole

(57) ABSTRACT

There is described novel bonding and interconnecting techniques for use with semiconductor die for the creation of thermally efficient, physically compliant Ultra High Vacuum Tubes and the novel tube resulting therefrom.

25 Claims, 2 Drawing Sheets

SEMICONDUCTOR DIE ATTACHMENT FOR HIGH VACUUM TUBES

FIELD OF THE INVENTION

The present invention is directed to the efficient and physically compliant attachment and interconnect of semiconductor die or semiconductor die assemblies in ultra high vacuum tubes.

BACKGROUND OF THE INVENTION

The present invention teaches a vacuum-compatible die bonding technique suitable for mounting die within a vacuum housing for use in a ultra high vacuum (UHV) tube. An application where this invention is particularly valuable is when used with charge coupled devices (CCDs) or CMOS in a vacuum environment in which the semiconductor die (CCD or CMOS) is directly electron bombarded in an imaging system as, for example, as is disclosed in U.S. Pat. No. 4,687,922 (CCDs) or as disclosed in U.S. Pat. No. 6,285,018 B1 (CMOS). This invention is also applicable for attaching hybrid read out integrated circuit devices (ROIC) to thermally mismatched substrates such as ceramics within photocathode based vacuum tubes.

In the prior art, as described for example in U.S. Pat. No. 6,281,572, an intermediate pedestal is used between mismatched materials. The pedestal makes use of both an intermediate thermal coefficient of expansion (TCE) and a restricted area in order to limit the TCE mismatch induced strain in the finished device. The induced strain in the finished device is roughly proportional to the TCE mismatch times the change in temperature from the point at which the braze material solidified times the linear dimension of the braze. In the prior art, a braze material was chosen that remained in it's solid form throughout the tube vacuum process cycle. Typical braze materials and melting temperatures included AuSn (~280° C.) and AuGe (~361° C.) alloys. Modern photocathode based sensors including semiconductor devices are typically sealed under ultra-high vacuum (UHV) conditions. In order to achieve these conditions, tube components are typically baked at temperatures in excess of 200° C. in vacuum to eliminate residual gasses from tube components. Typically, the brazes are aligned using fixtures in order to accurately set the position of the semiconductor device within the tube. The fixtures are later removed and the tube is run through a UHV seal cycle. The high temperature of the braze alloys is required in the prior art to insure that the semiconductor does not move during the vacuum sealing step. The downside of the high temperature braze is that it locks in a high degree of strain in the finished assembly when it is cooled to room temperature. Another approach used in the prior art is to simply minimize the maximum linear dimension of the braze pad in order to minimize strain. A 0.050" braze pad has been shown to work reasonably well with an AuSn braze. U.S. Pat. No. 6,507,147 describes a prior art package suitable for UHV applications that makes use of a small area braze. There is however a downside to this approach too. The use of a small pad limits the heat transfer area between the semiconductor device and the underlying substrate. In the case of electron bombarded CMOS image sensors or ROIC based CMOS anodes, heating of the sensor resulting from dissipation in the chip can and generally will result in degraded sensor performance. These difficulties in the prior art are avoided and/or considerably reduced through the use of physically compliant vacuum-compatible die bonding techniques enabling the efficient mounting of die within the vacuum area in a UHV tube.

In prior art UHV tubes such as the one described in U.S. Pat. No. 6,281,572, electrical connection between the semiconductor device and the inside of the vacuum envelope has been made through the use of wire-bonds that extend from the exposed surface of the semiconductor die to the underlying surface of the vacuum package. The use of wire-bonds is a well-established, reliable way to make multiple electrical connections between a semiconductor device and a thermal coefficient of expansion mismatched package. The down side of this approach is the additional package volume dedicated to the annular ring of pads that lie outside the projected outline of the overlying semiconductor die. Through the use of low melting point physically compliant braze materials, the connection pads can be moved below the semiconductor die, thereby conserving package volume and projected area.

SUMMARY OF THE INVENTION

The present invention minimizes or does away with the drawbacks of the prior art and in those instances in which a pedestal would have been used, eliminates this costly element. The present invention makes use of indium (melting point ~156° C.) or other low melting point (less than about 200° C.) metals or alloys of metals, that remain ductile over the anticipated useful temperature range, to bond the semiconductor device to the underlying substrate. The choice of a low melting point bonding material means that the material will re-melt during vacuum processing of the tube. Pads are typically used as an intermediate between the semiconductor device or other substrate and the braze material, in order to specify the braze geometry and control the metallurgy of the braze. The re-melt issue is addressed in one of two ways. The first approach is to use a small centrally located pad (~0.050" max. linear dimension) on which a conventional braze material is used surrounded by a pad or pads on which a low melting point braze material is used. The second, and the preferred approach, is to generate an array of small, preferably round pads in a matching pattern on the semiconductor device and the underlying substrate. Through a suitable choice of pad, metallurgy, geometry, number, and braze material volume, the die will remain suitably aligned within the tube when the vacuum processes cause the braze material to melt, by virtue of the aligning force generated by the surface tension of the braze material. In fact, the described approach has lead to better reproducibility in the positioning of semiconductor devices and better flatness than that achieved by prior techniques used in this field. The surface tension generated force has been shown to be sufficient to support the die, without significant position shift, in an inverted position while in a fully molten state. Furthermore, experience has shown that larger linear dimensions can be used with an indium braze as described than would be predicted by simple scaling of AuSn braze results. This may be explained by the fact that the indium remains ductile and thereby may relieve some of the residual strain induced by the TCE mismatch. The use of multiple small pads can also be used to address heat transfer issues between the die and underlying substrate. Although each individual braze may be small, the brazes can be tightly packed so as to cover a large fraction of the full die area thereby facilitating efficient heat transfer. This approach has been shown to be effective for die of about 1 cm square with no indication that this technique would not scale to larger die.

Electrical connections to semiconductor devices can also be achieved through the use of suitable metallurgy. The technique accommodates significant thermal coefficient of expansion mismatch and has been demonstrated to be reliable through multiple thermal cycles between room temperature and that of atmospheric pressure liquid nitrogen. The technique has the further major benefit for proximity-focused tubes that, unlike wire bonding, the new contacting scheme is effectively planar on the exposed surface. This allows the overlying tube wall to be moved closer to the semiconductor device surface without excessive yield losses. This in turn results in higher performance image sensors. This is particularly true for proximity focused vacuum image sensors where the semiconductor device is a CCD or CMOS imager. In this case, cathode-semiconductor gap or MCP-semiconductor gap directly affects imager resolution and a performance parameter called "Halo". Tube gaps are typically limited by the peak electric field present between the two biased planes of the tube, typically a photocathode or micro-channel plate (MCP) on the negative polarity side and the semiconductor device on the positive side. The design gap can be estimated by adding the gap that creates the maximal design electric field to the height of any projections above the plane of the semiconductor device plus the parallelism tolerance of the package including that of the anode braze. For example, if one were to design for a maximum electric field of 200 V/mil and a 1000 V potential drop, the maximal electric field design gap would be 5 mils. Typical wire bonds extend above the plane of the anode by approximately 3 mils. Typical parallelism tolerances for fixtured brazes are ~2 mils. Consequently, a ~10 mil design gap is required in order to achieve a high production yield. Now if we take the case of semiconductor die bonded down as taught by this invention, the maximal field remains the same so we start with a 5 mil gap. Protrusion above the plane of the anode is <<1 mil. Parallelism tolerances have been demonstrated to be <0.5 mils. Consequently, the design gap for high yield production drops to ~5.5 mils. This is a first order change that results in greatly improved resolution and Halo. Thus the present invention contributes to higher performance proximity focused tubes with the likelihood of improved resolution for such tubes.

Similar electrical interconnect approaches have been investigated by the integrated circuit industry for use with flip-chip packaging and ball grid arrays (BGAs); however, the techniques developed for use with BGAs make use of organic materials. U.S. Pat. No. 6,656,768 describes a BGA packing approach. Organics make their way into the process in a number of ways: as a solder paste binder, as a soldering flux and finally as an under-fill material to enhance the mechanical and thermal performance of the finished device. However, organics cannot be used in a UHV processing environment since the photocathode of the vacuum tube for which this invention is intended suffers as a result of the use of organics in these roles. Organics have a tendency to break down and out-gas at the elevated temperatures required for UHV processing. Consequently, the elimination of the need to use organic compounds in these roles is another advantage of this invention.

It is a further goal of this invention to be able to employ commercially available ceramic packages that are designed using standard processes and design rules. This includes making use of standard multi-layer ceramic packages as, for example, are described in Kyocera's "Multilayer Ceramics Design Guidelines", 1995 CAT/2T9504THA/1244E. Other techniques for the manufacture of ceramic packages exist and may be used in this invention.

Multiple die bond pads are used to secure the semiconductor anode to the underlying substrate. In the preferred embodiment at least three distinct pads are used. The die is secured via brazing. A low melting point, low vapor pressure, malleable material is used for the braze. Indium and alloys thereof are good braze materials. Pads are typically deposited on the semiconductor device in a pattern that matches that of the intended substrate, typically a ceramic package. The following stack of materials has been demonstrated to generate a suitable braze pad:

$SiO_xN_y$—3000 Angstroms (The thickness and x/y ratio of this layer are not critical)
Chrome—2000 Angstroms
Gold—500 Angstroms An alternate stack of materials has also been demonstrated to generate a suitable braze pad:

$SiO_xN_y$—3000 Angstroms (The thickness and x/y ratio of this layer are not critical)
Titanium—200 Angstroms
Platinum—5000 Angstroms
Gold—500 Angstroms The $SiO_xN_y$ layer acts as an insulator and a secondary barrier layer that is particularly useful when depositing on a silicon substrate. The chrome and platinum layers act as a barrier layer for the braze material. The final gold layer acts as a wetting agent for indium based brazes. This allows organic-free, flux free brazing to be performed with high yield. It should be noted that excessively thick gold layers can interfere with the reliability of the bond. The binary phase diagram reveals that a brittle inter-metallic compound, presumably $AuIn_2$, is formed between indium and gold when they are allowed to mix in a molten state during the described braze and then solidify. This phase appears as brittle, roughly cubic crystals, in a matrix of relatively pure malleable indium. If the crystal fraction exceeds a critical value, the brazes will no longer be malleable and substrate failure may occur. Gold enters the braze from both the semiconductor braze pads and the package die bond pads. The braze between the semiconductor device and the package is typically designed to be roughly columnar. Consequently, the fraction of gold in the indium braze, assuming a fixed deposition thickness on both surfaces and equilibrium braze conditions, is roughly inversely proportional to both indium mass/unit-area and bond thickness. In practice using standard gold coated Kyocera die bond pads and the described semiconductor bond pads, braze thicknesses below 4 mils have proven to be unreliable, while brazes>=6 mils thick have proven to be quite robust. Optimal semiconductor die positioning performance is obtained when the braze pad diameter is greater than or equal to the braze thickness. Currently, 10 mil or larger pads are used to achieve a 6 mil braze thickness.

DETAILED DESCRIPTION OF THE DRAWINGS

Figure 1:
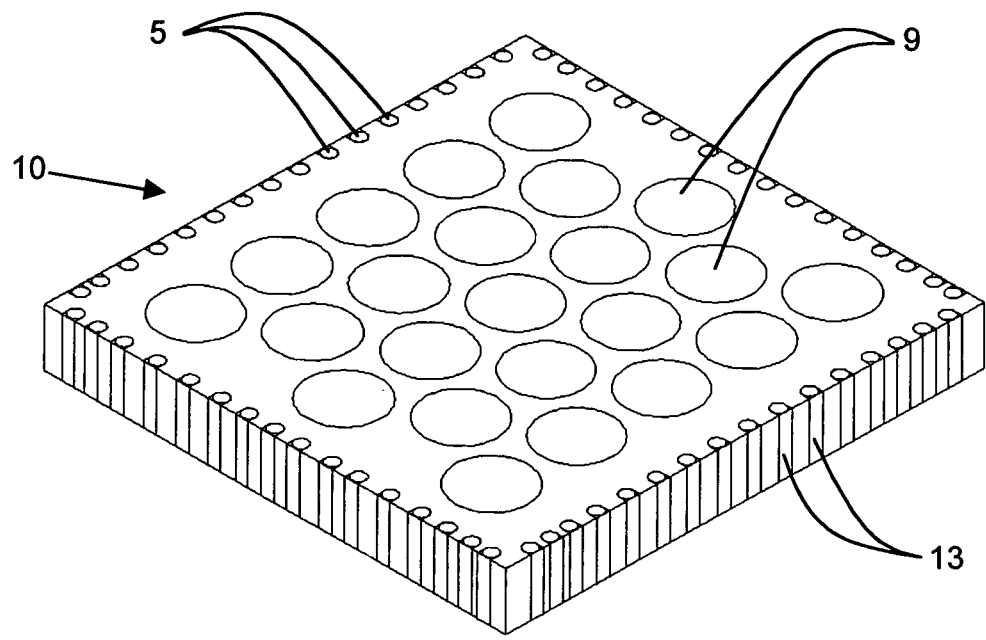
FIG. 1 is a schematic illustration of a semiconductor device showing the location and distribution of bond pads on a bottom surface.

FIG. 1 illustrates a semiconductor device 10 suitable for use in the invention. This device is envisioned to be but not limited to an imaging sensor such as an electron bombarded CCD (EBCCD) or an electron bombarded CMOS or electron bombarded active pixel sensor (EBAPS), or an electron sensitive ROIC. In the case of the EBCCD and EBAPS devices, the semiconductor device may lie in a thin layer on the side opposite that shown in FIG. 1. In these devices, the semiconductor device is typically bonded to a support structure of silicon or glass. This facilitates backthinning of the semiconductor device as for example is explained in U.S. Pat. No. 4,687,922 or in pending application Ser. No. 10/795,040 for improved electron bombarded imaging of such devices. In these cases, 10 represents this bonded structure or semiconductor device. U.S. Pat. No. 6,020,646 describes one method of making a UHV compatible integrated circuit die assembly. Items 5 and 9 both represent braze pads of different sizes. Braze pad 5 overlies interconnect trace 13 thereby electrically connecting a bond pad on the opposite side of the die with interconnect braze pad 5. Braze pad 9, is electrically isolated from interconnect traces 13 and interconnect braze pads 5. In the case of a silicon substrate, the pads and interconnects are typically deposited over a $SiO_xN_y$ layer, ~3000 Angstroms in thickness. In the case of an EBCCD or EBAPS device mounted on Pyrex, the $SiO_xN_y$ layers extent may be limited to where the trace 13 overlies the silicon present on the front and side of the device. Electrical traces 13 are typically comprised of a 500 Angstroms thick titanium layer followed by 20,000 Angstroms of aluminum, followed by 500 Angstroms of chrome. Bond pads 5 and 9 are typically comprised of: Chrome—2000 Angstroms and Gold—500 Angstroms. Semiconductor device 1 is approximately one cm square.

Pure indium is the preferred braze material. However, materials including tin, silver, aluminum and gallium are useful in conjunction with each other or in conjunction with indium to form low melting point, low vapor pressure malleable braze joints. Other materials common in braze or solder materials such as bismuth, cadmium and lead exhibit somewhat higher vapor pressures and consequentially should be used with great caution in UHV applications.

Braze pad geometry can be varied over a fairly wide latitude. Generally though, there are a few guidelines that have resulted in reliable bonds. First, minimum pad size should be >=the braze thickness. When using indium as the braze material and standard Kyocera pad metallizations, a nominal braze thickness of 5–8 mils is targeted. This is a functionally useful range in that indium volume can be adjusted to compensate for package tolerances. In other words, the braze thickness can be used to shim the gaps to meet manufacturing gap targets thereby allowing package tolerances to be relaxed. This results in a less expensive package. It should be noted that both average gap and parallelism may be shimmed in this manner. The minimum braze pad size is therefore specified by the upper range of the targeted braze thickness. Interconnect pads 5 are approximately 10 mils in diameter. In practice, a minimum pad size of 10 mils diameter has been used with the 5–8 mil target braze thickness. Mixed pad sizes have been used on individual die without any apparent problems. Generally, pad arrays have been symmetrical so as to attempt to balance the TCE induced strain evenly amongst the pads. The pads, 9, are electrically isolated, they primarily serve in a physical and heat transfer role. The pads, 9, are typically larger than the electrical interconnect pads 5. An array of pads, 9, sized in the 50 to 100 mil range appear to work well to locate and transfer heat away from the semiconductor die assembly 10.

The targeted braze thickness of >5 mils has an additional vacuum processing benefit. The larger the gap between the base of the semiconductor die and the package facilitates more effective pumping of these surfaces during the vacuum bake cycle required in UHV tube processing.

Electrical connection to the braze pads is made via a separate metal trace 13. This trace is deposited between the $SiO_xN_y$ layer and the first pad metal layer. Electrical traces are typically comprised of a 500 Angstrom thick titanium layer followed by 20,000 Angstroms of aluminum, followed by 500 Angstroms of chrome. The electrical traces are typically routed from the bond pad, around the sides of the die to the back bonding surface. When indium is used as the braze material, no wetting of the braze material to the traces is observed, no additional masking layer is required. Alternatively, this same metallization deposition can be used within a generic ceramic package to redistribute the physical locations of bond pads so as to reflect the bond pad layout of a specific die.

Figure 2:
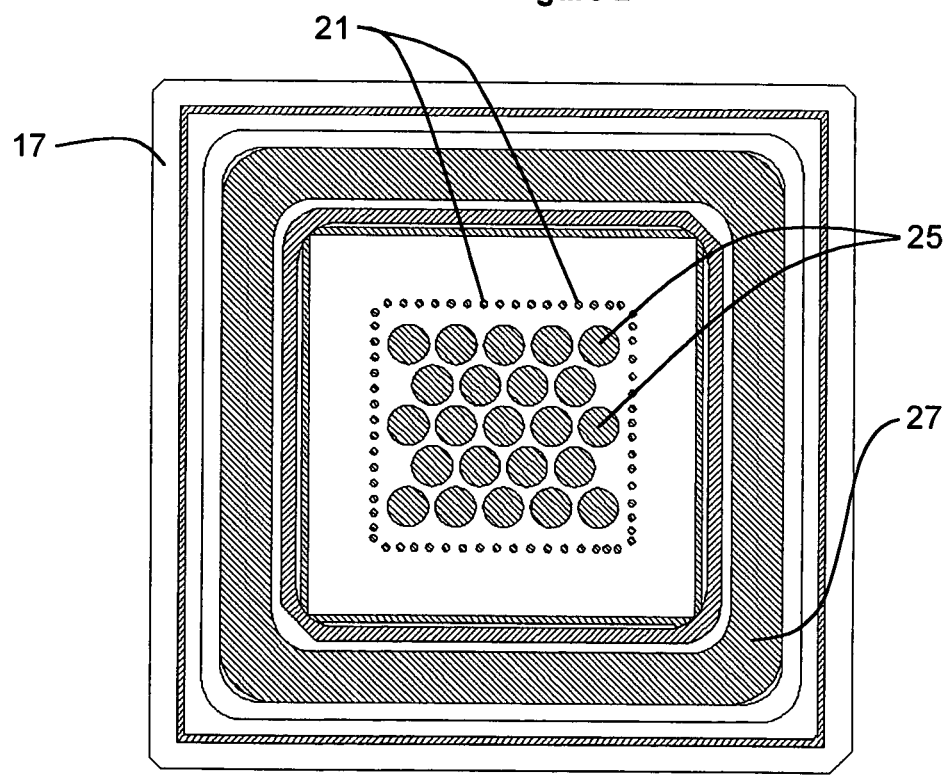
FIG. 2 is a schematic illustration of the mating pattern of bond pads within a ceramic vacuum tube body.

Referring now to FIG. 2 the tube body of the preferred embodiment, 17, is described, in great detail in U.S. Pat. No. 6,507,147. This patent does not describe the die and interconnect approach disclosed herein. Although a unitary ceramic body represents the preferred approach, the die and interconnect technique herein described is compatible with more traditional metal/ceramic brazed ultra high vacuum tube assemblies such as described in Publication US 2003/0066951 A1 for an intensified hybrid solid-state sensor. Interconnect pads 21 and die bond pads 25 are generated per standard multilayer ceramic package manufacturing methods as described in Kyocera's "Multilayer Ceramics Design Guidelines", 1995 CAT/2T9504THA/1244E and similar design guides from other multilayer ceramic supplies. Die bond pads 25 are typically electrically connected together internally and brought out on a single pin from the opposite side of the package. Interconnect pads 21 are individually routed to separate pins on the opposite side of the package. 27 designates a metallized pad.

The preferred shape of the die bond and interconnect pads is round, though non-round pads have been successfully used. The die bond pads 25 are packed fairly densely in order to efficiently transfer heat from the semiconductor device to the package's back wall. In FIG. 2, the outline traced by interconnect pads 21 is approximately 1 cm square, roughly matching the semiconductor die size.

The semiconductor die 10 is assembled with package 17 by placing braze material between each of the mating pads and running the physically stacked parts through a braze cycle. When indium is used as the braze material, the assembly will stick together when the parts are physically aligned and pressed together. No additional alignment or fixturing is required. Once a few of the sights bond, the surface tension of the braze material will both align in X and Y directions and pull the parts together in the Z dimension.

During the braze process an indium preform is positioned over metallized pad 27. This causes the indium to melt and wet to pad 27. This indium layer will subsequently be used to seal the vacuum tube to the photocathode.

Figure 3:
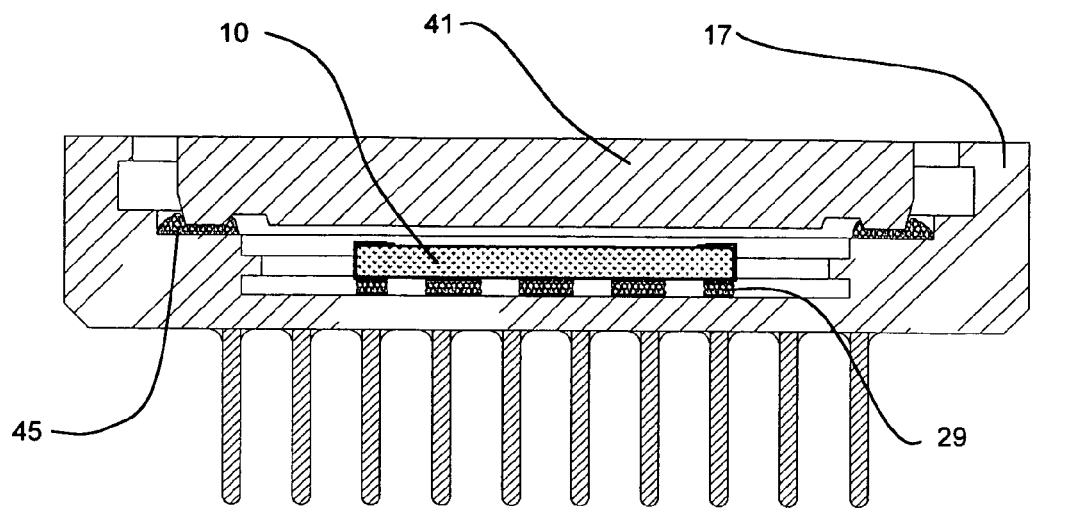
FIG. 3 is a schematic cross section of a malleable braze showing the semiconductor device and its package.

FIG. 3 represents an un-scaled schematic cross section of the bonded die including an interconnect braze. In this Figure, semiconductor device 10 is brazed to package 17 via a malleable braze 29. When using the metallization recipes listed for pad 5 and a Kyocera standard interconnect pad metallization for pad 21 (see FIG. 2), the volume of braze material is chosen in order to achieve a braze thickness of at least 4 mils. Layer 33 (see FIG. 4) represents the $SiO_xN_y$ layer, which is typically approximately 3000 Angstroms thick and serves to electrically isolate interconnect traces. Almost any insulator can be used for this purpose, $SiO_xN_y$ was chosen because it is easy to deposit with a minimum of pinholes, a minimum of stress and it is easily etched from regions that need to be accessed. Layer 37 represents that portion of the semiconductor device that contains active circuitry and interconnects.

After the sensor has been run through the braze process, it is subjected to a vacuum bake-out and sealed to an activated photocathode 41. The seal is accomplished by pressing photocathode 41 into the indium layer 45 that was previously wet to surface 27. The proximity of photocathode 41 to semiconductor device 1 illustrates the benefit of this approach over one that requires wire bonds off the top surface of 10. Similarly, with standard flatness tolerances on package 17 on the order of 3 mils, the advantage of being able to shim the gap between 10 and 41 by measuring package depth and adjusting the volume of braze material used in braze 29 becomes apparent.

Figure 4:
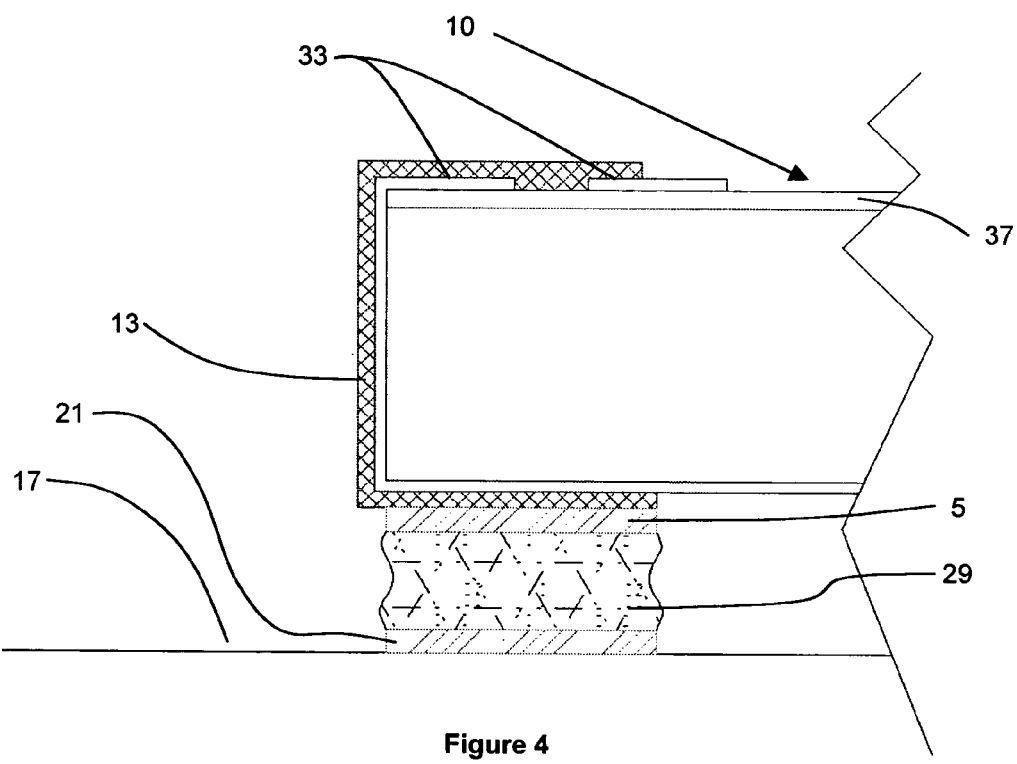
FIG. 4 is a schematic of a cross sectional view of a bonded die in a packaged vacuum tube.

FIG. 4 is a cross-sectional view of a semiconductor die assembly, 10, attached via a low melting temperature braze material, 29, to the surface of a ceramic package 17. The braze is formed between package pad 21 and semiconductor die assembly electrical interconnect pad 5. Electrical interconnect pad 5 is connected to the semiconductor circuit indicated by layer 37 via trace 13. Electrical isolation of pad 5 and trace 13 is assured via $SiO_xN_y$ layer 33. FIG. 4 is not drawn to scale, the thin films are expanded for clarity.

While there has been shown and discussed what are presently considered a preferred embodiment, it will be obvious to those skilled in the art that various changes and modifications may be made without departing from the scope of this invention and the coverage of the appended claims.

The invention claimed is:

1. An ultra high vacuum tube as an imaging device comprising a semiconductor die, a ceramic housing for the tube, said die having a plurality of electrical connections to said ceramic housing by pads in said ceramic housing and by pads in said die and by brazing materials between said pads, and an ultra high vacuum enclosed in said housing.

2. An ultra high vacuum tube in accordance with claim 1 including a photocathode within said vacuum within said housing.

3. An ultra high vacuum tube in accordance with claim 2 in which said semiconductor die comprises a charge coupled device and in which said charge coupled device is aligned with said photocathode for proximity imaging.

4. An ultra high vacuum tube as an imaging device comprising a semiconductor die comprising a CMOS device, a ceramic housing for the tube, said die having a plurality of electrical connections to said ceramic housing by pads in said ceramic housing and by pads in said die and by brazing materials between said pads, an ultra high vacuum enclosed in said housing, and a photocathode within said vacuum within said housing, said CMOS device being aligned within said vacuum with said photocathode for proximity imaging.

5. An ultra high vacuum tube as an imaging device comprising a semiconductor die comprising a back-thinned silicon imaging sensor bonded to a support substrate, a ceramic housing for the tube, said die having a plurality of electrical connections to said ceramic housing through pads in said ceramic housing and pads in said die and by brazing materials between said pads, and an ultra high vacuum enclosed in said housing, and a photocathode within said vacuum within said housing, in which said die is aligned with said photocathode within said vacuum for proximity imaging.

6. An ultra high vacuum tube in accordance with claim 4 in which said brazing material comprises indium.

7. An ultra high vacuum tube as an imaging device comprising a semiconductor die, a ceramic housing for the tube, said die having a plurality of electrical connections to said ceramic housing by pads in said ceramic housing and by pads in said die and by brazing materials between said pads; and an ultra high-vacuum enclosed in said housing, and a photocathode within said vacuum within said housing; said pads comprising $SiO_xN_y$, Chrome and Gold.

8. An ultra high vacuum tube as an imaging device comprising a semiconductor die, a ceramic housing for the tube, said die having a plurality of electrical connections to said ceramic housing by pads in said ceramic housing and by pads in said die and by brazing materials between said pads; and an ultra high vacuum enclosed in said housing; and a photocathode within said vacuum within said housing; said pads comprising $SiO_xN_y$, Titanium, Platinum and Gold.

9. An ultra high vacuum tube in accordance with claim 1 in which said brazing material comprises a low melting point metal or alloy of metal.

10. An ultra high vacuum tube in accordance with claim 6 in which said CMOS die comprises an APS device aligned to said photocathode within said tube in a manner to be electron bombarded during exposure of said photocathode in said tube.

11. An ultra high vacuum tube in accordance with claim 7 in which said brazing material comprises a low melting point metal or alloy of metal.

12. An ultra high vacuum tube in accordance with claim 2 in which said brazing material comprises a low melting point metal or alloy of metal.

13. An ultra high vacuum tube in accordance with claim 11 in which said brazing material comprises indium.

14. An ultra high vacuum tube as an imaging device comprising a semiconductor die, a housing of a different material for the tube, said die being electrically connected to said housing by pads in said housing and by pads in said die and by brazing materials between said pads, and an ultra high vacuum enclosed in said housing.

15. An ultra high vacuum tube as in claim 14 including a photocathode within said vacuum.

16. An ultra high vacuum tube in accordance with claim 14 in which there are at least three pad positions in said housing and at least three matching pad positions in said die.

17. An ultra high vacuum tube as an imaging device comprising a semiconductor die, a ceramic housing for the tube, said die having a plurality of electrical connections to said ceramic housing by pads in said ceramic housing and by pads in said die and by brazing materials between said pads, and an ultra high vacuum enclosed in said housing, and an MCP within said vacuum in alignment with said semiconductor die to create an image at the input of said semiconductor die corresponding to an input image to said MCP.

18. An ultra high vacuum tube as an imaging device comprising a semiconductor die, a housing of a different material for the tube, said die being electrically connected to said housing by pads in said housing and by pads in said die and by brazing materials between said pads, and an ultra high vacuum enclosed in said housing, the gap between said semiconductor die and said housing facing said die being no greater than about 1× the diameter of the braze pads used to join said semiconductor to said housing.

19. An ultra high vacuum tube as an imaging device comprising a semiconductor die, a ceramic housing for the tube, said die having a plurality of electrical connections to said ceramic housing by pads in said ceramic housing and by pads in said die and by brazing materials between said pads, and an ultra high vacuum enclosed in said housing, and a photocathode and an MCP within said vacuum all in alignment with said semiconductor die to create an image at the input of said semiconductor die corresponding to an input image to said MCP formed from an electron image generated by the photocathode.

20. An ultra high vacuum tube in accordance with claim 19 in which said semiconductor die comprises a backthinned CMOS supported on a substrate.

21. An ultra high vacuum tube in accordance with claim 19 in which said semiconductor die comprises a backthinned CCD supported on a substrate.

22. An ultra high vacuum tube in accordance with claim 19 in which said semiconductor die comprises an ROIC.

23. An ultra high vacuum tube as an imaging device comprising a semiconductor die, a ceramic housing for the tube, said die having a plurality of electrical connections to said ceramic housing by pads in said ceramic housing and by pads in said die and by brazing materials between said pads, and an ultra high vacuum enclosed in said housing, and in which said semiconductor die comprises a backthinned CMOS supported on a substrate.

24. An ultra high vacuum tube in accordance with claim 1 in which said semiconductor die comprises a backthinned CCD supported on a substrate.

25. An ultra high vacuum tube as an imaging device comprising a semiconductor die, a ceramic housing for the tube, said die having a plurality of electrical connections to said ceramic housing by pads in said ceramic housing and by pads in said die and by brazing materials between said pads, and an ultra high vacuum enclosed in said housing, said semiconductor die comprising an ROIC.

* * * * *